United States Patent
Durst et al.

(10) Patent No.: US 10,847,336 B2
(45) Date of Patent: Nov. 24, 2020

(54) ANALYTICAL X-RAY TUBE WITH HIGH THERMAL PERFORMANCE

(71) Applicant: Bruker AXS, GmbH, Karlsruhe (DE)

(72) Inventors: Roger D. Durst, Pfinztal (DE); Carsten Michaelsen, Artlenburg (DE); Paul Radcliffe, Hamburg (DE); Jenss Schmidt-May, Hamburg (DE)

( * ) Notice: Subject to any disclaimer, the term of this patent is extended or adjusted under 35 U.S.C. 154(b) by 476 days.

(21) Appl. No.: 15/679,853

(22) Filed: Aug. 17, 2017

(65) Prior Publication Data

US 2019/0057832 A1 Feb. 21, 2019

(51) Int. Cl.
*H01J 35/08* (2006.01)
*H01J 35/10* (2006.01)
(Continued)

(52) U.S. Cl.
CPC ............... *H01J 35/08* (2013.01); *G03F 7/16* (2013.01); *G03F 7/36* (2013.01); *H01J 35/105* (2013.01);
(Continued)

(58) Field of Classification Search
CPC ........... H01J 2335/081; H01J 2335/084; H01J 2335/1204; H01J 2335/1291;
(Continued)

(56) References Cited

U.S. PATENT DOCUMENTS 4,382,985 A * 5/1983 Hattori ................ C08F 2/52
427/488
4,972,449 A 11/1990 Upadhya
(Continued)

FOREIGN PATENT DOCUMENTS

| EP | 0432568 A2 | 6/1991 |
|----|------------|--------|
| EP | 1557865 A1 | 7/2005 |
| EP | 2779202 A2 | 9/2014 |

OTHER PUBLICATIONS

Carlos Polanco, "Enhancing phonon flow through 1D interfaces by impedance Matching", 2014, Journal of Applied Physics, pp. 1-17. (Year: 2015).*

(Continued)

*Primary Examiner* — Dani Fox
*Assistant Examiner* — Soorena Kefayati
(74) *Attorney, Agent, or Firm* — Benoit & Côté Inc.

(57) ABSTRACT

An analytical X-ray tube with an anode target material that emits characteristic X-rays in response to excitation by an electron beam may include any of several advantageous features. The target material is deposited on a diamond substrate layer, and a metal carbide intermediate layer may be provided between the target material and substrate that provides enhanced bonding therebetween. An interface layer may also be used that provides an acoustic impedance matching between the target material and the substrate. For a low thermal conductivity target material, a heat dissipation layer of a higher thermal conductivity material may also be included between the target material and substrate to enhance thermal transfer. The target material may have a thickness that corresponds to a maximum penetration depth of the electrons of the electron beam, and the structure may be such that a predetermined temperature range is maintained at the substrate interface.

13 Claims, 4 Drawing Sheets

(51) Int. Cl.
*G03F 7/36* (2006.01)
*H01J 35/12* (2006.01)
*G03F 7/16* (2006.01)
*H01J 35/18* (2006.01)

(52) U.S. Cl.
CPC ............ *H01J 35/108* (2013.01); *H01J 35/12* (2013.01); *H01J 35/116* (2019.05); *H01J 35/186* (2019.05); *H01J 2235/081* (2013.01); *H01J 2235/084* (2013.01); *H01J 2235/1204* (2013.01); *H01J 2235/1291* (2013.01); *H01J 2235/1295* (2013.01); *H01J 2235/183* (2013.01)

(58) Field of Classification Search
CPC ......... H01J 2335/1295; H01J 2335/183; H01J 35/108; H01J 2235/081; H01J 2235/084; H01J 2235/1204; H01J 2235/1291; H01J 2235/1295; H01J 2235/183; H01J 35/08; H01J 35/105; H01J 35/116; H01J 35/12; H01J 35/186; G03F 7/16; G03F 7/36
See application file for complete search history.

(56) References Cited

U.S. PATENT DOCUMENTS

| | | | |
|---|---|---|---|
| 5,148,462 A | 9/1992 | Spitsyn | |
| 5,602,899 A | 2/1997 | Larson | |
| 5,783,316 A | 7/1998 | Colella | |
| 5,878,110 A | 3/1999 | Yamamoto | |
| 6,078,644 A * | 6/2000 | Day | H01J 35/108 378/143 |
| 6,430,264 B1 * | 8/2002 | Lee | H01J 35/108 378/143 |
| 6,477,235 B2 | 11/2002 | Chornenky | |
| 6,690,765 B1 * | 2/2004 | Miller | H01J 35/08 378/119 |
| 6,727,117 B1 | 4/2004 | McCoy | |
| 6,850,598 B1 | 2/2005 | Fryda | |
| 7,158,612 B2 | 1/2007 | Rusch | |
| 7,359,487 B1 * | 4/2008 | Newcome | H01J 35/08 378/119 |
| 7,443,953 B1 | 10/2008 | Yun | |
| 8,243,884 B2 * | 8/2012 | Rodhammer | C22C 26/00 378/141 |
| 9,020,101 B2 | 4/2015 | Omote | |
| 9,748,070 B1 * | 8/2017 | Wall | H01J 35/14 |
| 2005/0213711 A1 * | 9/2005 | Ukita | H01J 35/12 378/141 |
| 2008/0075229 A1 | 3/2008 | Ryan | |
| 2009/0129551 A1 * | 5/2009 | Butler | H01J 35/12 378/143 |
| 2012/0106711 A1 * | 5/2012 | Allen | H01J 35/101 378/132 |
| 2012/0228526 A1 * | 9/2012 | Vaschenko | G03F 7/70033 250/504 R |
| 2014/0112450 A1 * | 4/2014 | Ogura | H01J 35/16 378/121 |
| 2014/0185778 A1 * | 7/2014 | Lee | H01J 35/12 378/124 |
| 2014/0369471 A1 * | 12/2014 | Ogura | H01J 35/08 378/62 |
| 2015/0092924 A1 * | 4/2015 | Yun | H01J 35/12 378/143 |
| 2015/0280679 A1 * | 10/2015 | Nikkel | H01L 21/76814 310/365 |
| 2015/0311026 A1 * | 10/2015 | Tsukamoto | H01J 35/32 378/62 |
| 2016/0064175 A1 * | 3/2016 | Yun | G03F 7/16 378/143 |
| 2016/0064176 A1 * | 3/2016 | Xiang | H05G 1/025 378/138 |
| 2016/0300686 A1 * | 10/2016 | Dalakos | H01J 35/12 |
| 2016/0351370 A1 * | 12/2016 | Yun | H01J 35/08 |
| 2018/0005794 A1 * | 1/2018 | Liang | H01J 35/105 |
| 2019/0252150 A1 * | 8/2019 | Yamada | H01J 35/18 |

OTHER PUBLICATIONS

Kumaran, C.R. et al., "Effect of temperature on the stability of diamond particles and continuous thin films by Raman imaging", J. Nanopart Res 15:1509 (Feb. 27, 2013).

Chung, Chih-Yu et al., "Effect of Titanium Addition on the Thermal Properties of Diamond/Cu—Ti Composites Fabricated by Pressureless Liquid-Phase Sintering Technique", The Scientific Word Journal, vol. 2014, Article ID 713537 (Jan. 28, 2014).

Xia, Yang et al., "Effect of carbide formers on microstructure and thermal conductivity of diamond-Cu composites for heat sink materials", Transactions of Nonferrous Metals Society of China, v. 19 (2009) 1161-1166.

Zink, Frank E., "The AAPM/RSNA Physics Tutorial for Residents X-ray Tubes", Imaging & Therapeutic Technology, v. 17 No. 5 (1997).

Grinder, D.E., et al., Electron beam melting in microfocus x-ray tubes, J. Phys: Appl. Phys. 19 (1986) 2281.

http://www.diamond-materials.com/EN/products/cvd_for_xray/xray_targets.htm (Aug. 17, 2017).

Chung, C. et al., Sc. World Jml, dx.doi.org/10.1155/2014/713537 (Mar. 4, 2014).

Schubert et al., "Interfacial design of Cu-based composites prepared by powder metallurgy for heat sink applications", Material Science and Engineering A 475, 39-44 (Feb. 2008).

Li et al., "Thermal Boundary Conductance Across Metal-Nonmetal Interfaces: Effects of Electron-Phonon Coupling both in Metal and at the Interface", Eur. Phys. J.B. (2015) 88:149.

Hohensee, G. et al., "Thermal conductance of metal-diamond interfaces at high pressure", Nature Communications DOI:10.1038/ncomms7578, (Mar. 2015).

Polanco, C. et al.,"Design rules for interfacial thermal conductance: Building better bridges", Phys. Rev. B 95, 195303, (Aug. 23, 2016).

Anonymous, "Chromium carbide—Wikipedia", Aug. 6, 2017 (Aug. 6, 2017), XP055553276, Retrieved from the Internet: URL:https://en.wikipedia.org/w/index.php?title=Chromium_carbide&oldid=794264873 [retrieved on Feb. 7, 2019].

Askenazy S. et al., "Variation thermique de la vitesse de groupe moyenne des phonons dans le silicium entre 190° K et 350° K", Solid State Communications, Pergamon, GB, vol. 8, No. 6, Mar. 15, 1970.

\* cited by examiner

ANALYTICAL X-RAY TUBE WITH HIGH THERMAL PERFORMANCE

BACKGROUND OF THE INVENTION

Field of the Invention

This invention relates generally to the field of X-ray tubes and, more specifically, to the high power density generation of X-rays at a desired wavelength for use in analytical instruments.

Description of the Related Art

In X-ray tubes, a high energy electron beam (typically 10-100 keV) impinges on a target material to excite X-ray emission. In the case of X-ray tubes used for analytical applications, such as X-ray diffraction, the tubes are optimized to produce characteristic radiation at a particular wavelength. The most common X-ray tubes used for such applications incorporate target anodes comprised of chromium, cobalt, copper, molybdenum, silver rhodium or tungsten. The choice of the anode material is based upon the desired X-ray wavelength for the analytical application in question.

The process of electron impact excitation of X-rays is relatively inefficient. Typically, only about 1% of the energy of the incident electron beam is converted into X-rays, while the rest is lost as waste heat. In particular, the brightness of a conventional X-ray tube is directly proportional to the power density of the electron beam. This means that tubes are thermally limited, that is, that the maximum brightness is limited by thermal decomposition of the anode via melting or evaporation. X-ray tubes must therefore be operated at a temperature below the melting point of the anode material, typically by 50-200 K.

The temperature of an X-ray tube anode is proportional to the size of the anode spot, the power density of the electron beam and the thermal conductivity of the anode. In the particular case of a microfocus tube (defined as a tube in which the electron beam diameter is significantly smaller than the anode dimensions), the temperature of the anode is given by the following relation:

$$T_c - T_0 = \frac{1}{\kappa d}\sqrt{\frac{P \ln(2)}{4\pi}}$$

where $T_c$ is the maximum temperature (at the center of the electrode beam spot on the anode), $T_0$ is the ambient temperature at the (cooled) sides and rear of the anode target, P is the electron beam power loading, $\kappa$ is the target thermal conductivity and d is the diameter of the electron beam spot. From this it can thus be seen that, given a maximum permissible operating temperature $T_c$, increasing the thermal conductivity of the target material increases the allowed power loading.

Figure 1:
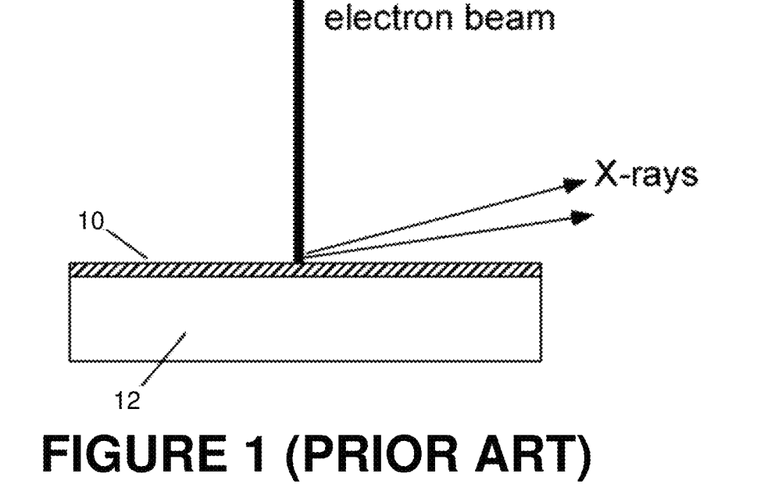
FIG. 1 is a schematic view of a target anode structure of a conventional analytical X-ray tube.

As mentioned above, in an analytical tube the choice of the target material (and, thus, its thermal conductivity) is determined by the desired wavelength for the X-ray application in question. It is, however, possible to increase the effective thermal conductivity of the target by locating a thin layer of the target material on a substrate with a higher thermal conductivity. Thus, as shown in FIG. 1, a layer of target material 10 may be coated on a substrate 12 of higher thermal conductivity. The characteristic X-rays emitted from the structure have a wavelength based on the target material 10, but the base material 12 provides an enhanced overall thermal conductivity that allows for a higher power density electron beam to be used without degradation of the target material.

Structures such as this have been used in the past. For example, a tungsten target has been located on a copper substrate, which efficiently removes waste heat. Diamond, which has an even higher thermal conductivity, has also been used with target materials in different configurations to provide an enhanced thermal conductivity in certain applications. Although the use of such a substrate material has allowed for enhanced heat dissipation, and therefore higher brightness X-ray beams, there are still limitations to the overall performance of such tubes.

SUMMARY OF THE INVENTION

In accordance with the present invention, an X-ray tube is provided that has improved thermal properties and that, therefore, enables generation of X-rays at a higher brightness than previously possible. The X-ray tube includes a target anode with a target material that emits characteristic X-rays in response to excitation by an electron beam. The target anode is located on a diamond substrate that dissipates heat from the anode. In a first embodiment, the X-ray tube also includes an intermediate layer between the diamond substrate and the target material that comprises a metal carbide, which provides a more stable bond with the diamond material to resist against shear stresses. This intermediate layer may be a layer that is deposited on the substrate during the fabrication process. It may also be formed by using a target material that comprises an alloy that includes a carbide forming metal, and thereafter inducing a reaction in the target material that results in formation of the layer.

The target material may be a relatively high thermal conductivity material such as copper or silver and, in such a case, the tube may be configured such that an operating temperature at a junction with the diamond substrate is between 600 K and 800 K. The invention may also include an interface layer located between the target material and substrate that includes a material having an acoustic impedance $Z_i$ that closely matches a geometric mean $\sqrt{Z_1 Z_2}$ of an acoustic impedance of the target material ($Z_1$) and an acoustic impedance of the diamond substrate ($Z_2$). In the exemplary version of this embodiment, this match is close enough that $Z_i/\sqrt{Z_1 Z_2}$ is between 0.75 and 1.5. The interface layer may also comprise a metal carbide and function as an intermediate bonding layer, as described above. In one variation, the target material comprises copper and the interface layer comprises at least one of titanium carbide (TiC) and chromium carbide $Cr_3C_2$. In another variation, the target material comprises silver and the interface layer comprises at least one of chromium carbide ($Cr_3C_2$) and molybdenum carbide (MoC).

In another aspect of the invention, the target material comprises a relatively low thermal conductivity material such as chromium (Cr), molybdenum (Mo), rhodium (Rh) or tungsten (W), and the X-ray tube also includes a heat dissipation layer between the target layer and the diamond substrate. This heat dissipation layer includes a material having a thermal conductivity significantly higher than (e.g., at least twice as high as) a thermal conductivity of the target material, and it serves to enhance heat dissipation from the target anode. In one version, the heat dissipation layer comprises copper or silver.

In an exemplary embodiment of the invention, the tube is operated in reflection mode such that the anode material, diamond substrate and other layers are oriented at a finite angle, typically 2-30 degrees, to the direction of the electron beam (i.e., the angle between the incident electrons and the target surface normal). In such a reflection mode tube, the target material should have a minimum thickness that corresponds to a maximum penetration depth of the electrons of the electron beam. For example, the thickness of a molybdenum target material may be 3-5 μm. The anode may also have a different configuration in which a surface of the target material exposed to the electron beam is surrounded by the diamond substrate in a lateral direction.

Fabrication of the X-ray tube involves depositing the layers of the structure in an appropriate order. The diamond substrate is first provided, after which appropriate thermal interface layers are deposited and, finally, the desired target material is deposited. In the embodiment for which the target material is a high thermal conductivity metal, such as copper or silver, an intermediate metal carbide layer may be used, the carbide layer being deposited on the diamond substrate prior to depositing the target material. In an alternative embodiment, a target material is provided that comprises a carbide forming metal or an alloy that includes a carbide forming metal. This material may then be deposited directly on the diamond substrate and, through suitable heat treatment, a chemical reaction may be induced that results in formation of the metal carbide adjacent to the diamond substrate. If a lower thermal conductivity target material is used, such as chromium, molybdenum, rhodium or tungsten, an acoustically-matched thermal interface layer is deposited onto the diamond substrate as with the higher thermal conductivity target material. However, a heat dissipation layer, comprising a high thermal conductivity material such as copper or silver, may also be deposited, and the target material deposited on the heat dissipation layer.

DETAILED DESCRIPTION

Figure 2:
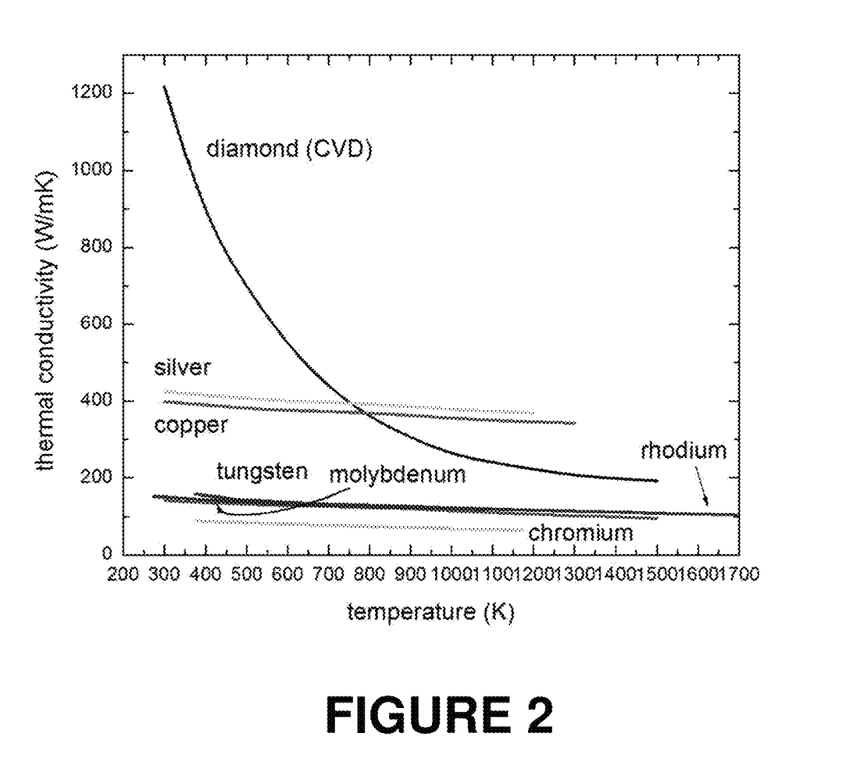
FIG. 2 is a graphical representation of the thermal conductivities of diamond and various X-ray tube anode target materials relative to temperature.

Although diamond substrates have been used in the past as a means for dissipating heat from a target material located thereupon, a number of practical difficulties still exist in X-ray tubes that use such an arrangement. FIG. 2 shows a plot of the thermal conductivity of diamond and metals commonly used in analytical X-ray tubes relative to temperature. As shown, diamond has a thermal conductivity that is significantly higher than copper or silver at room temperature, typically by a factor of three or four for synthetic (chemical vapor deposited) diamond. This makes diamond an attractive choice for a substrate in certain applications, but the thermal conductivity advantage that it provides is only present at relatively lower temperatures. At higher temperatures, above about 800 K, the thermal conductivity of both copper and silver exceeds that of diamond.

In practice, analytical X-ray tubes are frequently operated at temperatures approaching their melting point so as to maximize the brightness of the X-ray emission. The melting point of copper is about 1300 K, while that of silver is about 1200 K. As a typical peak operating temperature for these anode materials would be between 50 and 200 K below their melting points, it falls within a temperature range at which the thermal conductivity of diamond is inferior to either copper or silver. Consequently, for a tube having an anode of either copper or silver, an excessively thin anode layer on a diamond substrate will provide no advantage. That is, if the target layer is too thin, the temperature at the metal-diamond interface will be higher than 800 K, and the diamond will instead act as a thermal insulator (relative to copper or silver) and degrade the heat conduction rather than enhance it. If the target layer is too thick, however, the temperature may fall below the range at which the enhanced thermal conductivity of the diamond is effectively exploited. Thus, for silver and copper anodes on a diamond substrate, the interface temperature should ideally fall between 600 and 800 K.

The temperature versus depth in the metal interface layer can be calculated using the following relation:

$$T(z) - T_0 = \sum_{n=1}^{\infty} A_n \sinh\left(\frac{\lambda_n z}{a}\right)$$

where the coefficients $A_n$ are given by:

$$A_n = \frac{P}{d\kappa} \frac{1}{2\cosh(\lambda_n t/d)} \exp\left\{-\left(\frac{\lambda_n t/d}{2\sqrt{\ln(2)}}\right)^2\right\}$$

as above, P is the electron beam power loading, d is the diameter of the electron beam, a is the radius of the target anode (a>>d), κ is the thermal conductivity of the target material and $\lambda_n$ are the roots of the zero-order Bessel functions of the first kind.

Figure 3:
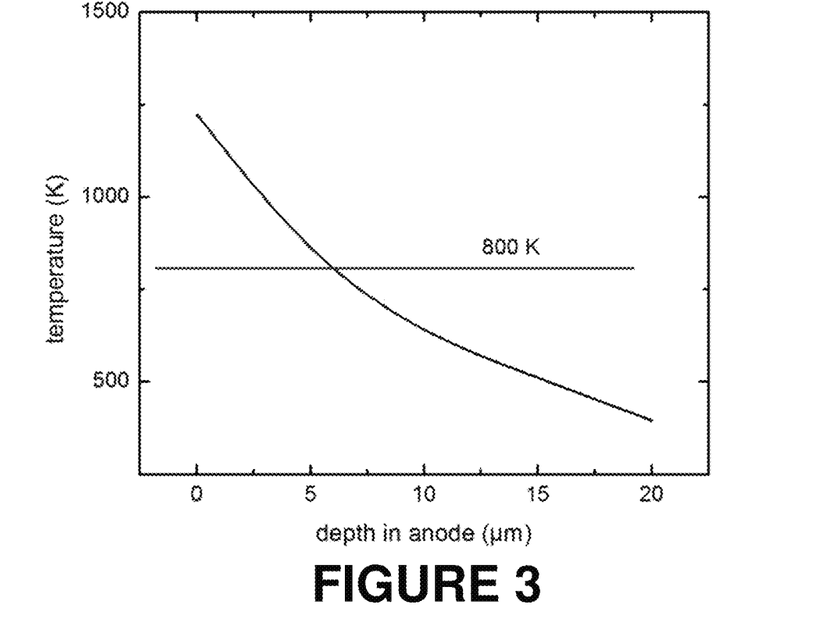
FIG. 3 is a graphical representation of temperature relative to depth for an X-ray tube anode using a copper target material.

Using the above relation, the temperature versus depth (in micrometers) for different materials may be determined. FIG. 3, for example, shows the temperature versus depth from the surface of a copper anode operated at peak temperature of 1200 K with an electron beam diameter of 20 μm. From the figure, it can be seen that the copper target must be at least 7 μm thick in order for the interface temperature to fall below 800 K. Conversely, the layer thickness should not be so thick that the temperature falls significantly below 600 K, or the enhanced thermal conductivity of the diamond is not fully exploited. Thus, in this example, the Cu target layer should not exceed about 12 μm thickness.

In light of the foregoing, the present invention provides an analytical X-ray tube having a metallic target layer on a diamond substrate for which the thickness of the target layer is such that the diamond/target interface temperature falls within a range of 50-200 K below the temperature at which the thermal conductivities of diamond and the target material are the same. For a copper or silver anode, the interface temperature should therefore be between 600 and 800 K. The exact thickness necessary to achieve this depends on the details of the tube design, including the electron beam diameter, d and the power loading P). Knowing these other parameters, the appropriate target layer thickness is calculated using the above relations or using finite element numerical simulations. For a typical microfocus tube with a power loading of 30-70 W and an electron beam diameter in the range of 20-50 microns, the thickness for copper or silver anodes will typically be in the range of 5-20 µm.

For other common metals used as target anodes in analytical tubes the situation is different, as their thermal conductivities are lower than diamond at all temperatures. By coating these metals directly onto a diamond substrate, an improvement in average thermal conductivity can be achieved. However, it is also possible to improve the average thermal conductivity further using a multilayer anode in which a diamond substrate is first coated with copper or silver (with an appropriate interface layer as described below), after which a thin layer of the target metal (such as Cr, Mo, Rh or W) is deposited on the copper or silver heat dissipation layer.

Figure 4:
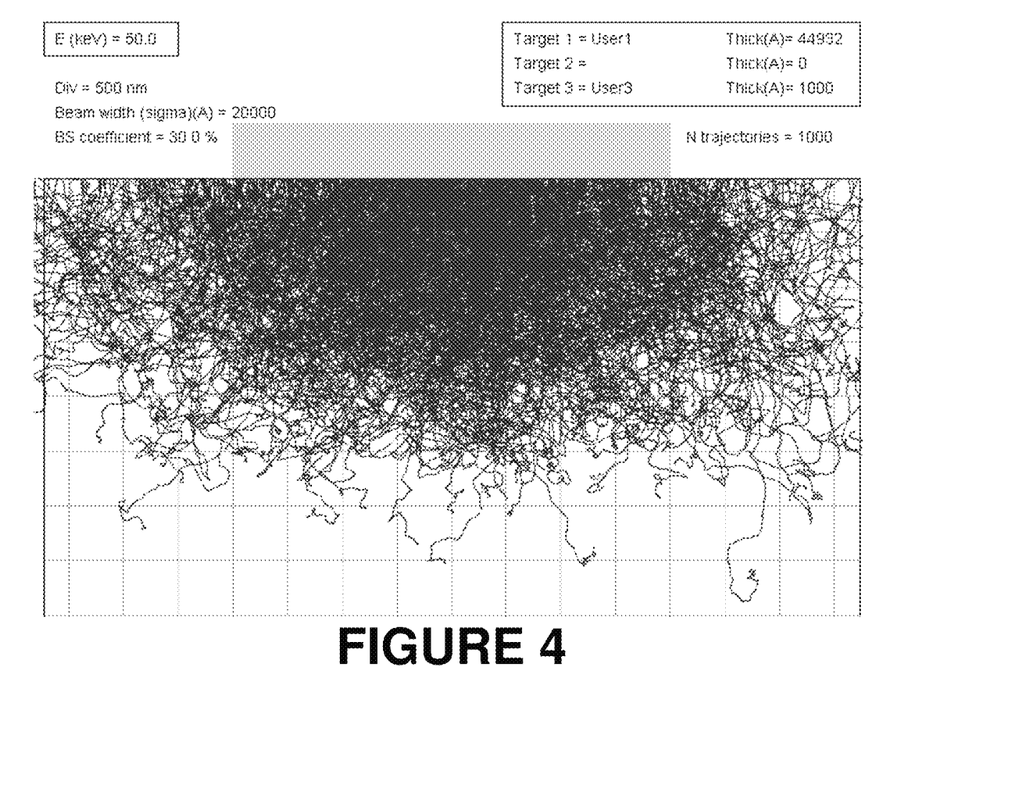
FIG. 4 is a graphical representation of a Monte Carlo simulation of 50 keV electron trajectories in a molybdenum target material of an X-ray tube anode.

In the particular case of molybdenum (Mo), the melting point of the anode is 2894 K, and it is thus typically desirable to operate the tube at 2700-2800 K. FIG. 4 shows a Monte Carlo simulation of 50 keV electron trajectories in a molybdenum target. From this it can be seen that 2-3 microns thickness of molybdenum is sufficient to completely attenuate the beam. Therefore, making the target layer thicker than this does not produce any additional X-rays. If a 3 µm thick layer of Mo was coated onto a diamond substrate, the diamond/anode interface temperature for a 20 µm electron beam would be 1900 K, which is just below the maximum operating temperature for diamond (that is, the temperature at which diamond decomposes into graphite). However, at these very high temperatures the thermal conductivity of diamond is quite low, less than half that of copper or silver.

In light of the foregoing, for analytical tubes using lower thermal conductivity target materials such as molybdenum, one embodiment of the present invention makes use of a multilayer construction as described above, in which the target material is coated onto a layer of copper or silver which is, in turn, located on a diamond substrate. For example, a 3-5 micron layer of molybdenum may be coated on a layer of copper or silver such that the interface temperature is below the melting point of the copper or silver layer (e.g., in the range of 1000-1200 K). This copper or silver layer is itself attached to a diamond substrate such that the operating temperature at the diamond interface is 600-800 K, as described above. This multilayer configuration has a significantly higher average thermal conductivity than a molybdenum target deposited directly onto a diamond substrate.

Figure 5:
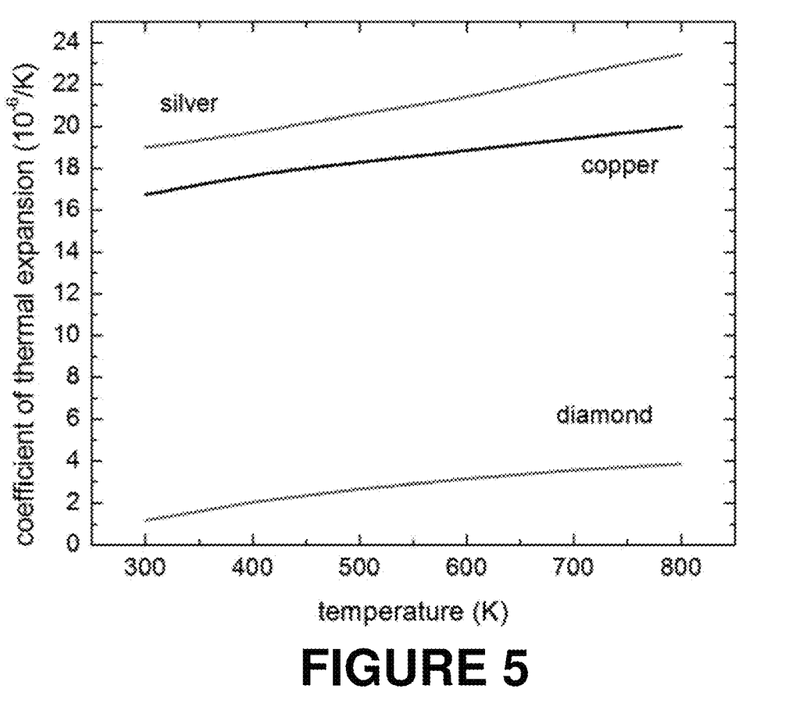
FIG. 5 is a graphical representation of the coefficient of thermal expansion for silver, copper and diamond.

The present invention also takes into account the mechanical considerations of the disclosed metal/diamond configurations. As shown in FIG. 5, the coefficient of thermal expansion is significantly lower in diamond compared to most metals and, as such, an interface between a metallic layer and the diamond substrate will be under high mechanical shear stress. Neither copper nor silver form stable carbides, and the mechanical adhesion between the diamond and metal target layer is via relatively weak Van der Waals adhesion. Therefore, there is a strong risk that the metal target will mechanically separate from the diamond substrate. Robust mechanical adhesion is important since even microscopic separations or voids between the diamond substrate and target metallic layer will result in "hot spots" that lead to rapid failure of the anode.

To improve mechanical adhesion, there are several different approaches that may be employed. In one embodiment, the target metal is alloyed with a small amount of a carbide forming metal. For example, a copper target may use copper that is alloyed with small amounts of boron, chromium or titanium. In another embodiment, a thin coating of a metal is interposed between the layers that forms a strong carbide bond with the diamond and an intermetallic bond with the target metal. In general, the carbide interface layer need be only a few molecules thick to provide strong mechanical adhesion, but the arrangement must also take into account the thermal performance of the structure. That is, the interface layer should offer both strong mechanical adhesion and low thermal resistance at the interface.

At the interface between any two materials there will be an interface thermal resistance, known as the Kapitza resistance. This interface resistance is especially significant for a metal-diamond interface due to the fact the heat conduction in metals and in diamond occur via different processes. In metals, the dominant carriers of heat are conduction electrons, while in diamond heat is carried by phonons (lattice vibrations). Therefore, in order to minimize the thermal resistance at a metal-diamond interface, it is necessary to optimize the coupling between the electron-mediated heat flow in the metal target and the phonon-mediated heat flow in the diamond.

Heat flow from a metal into diamond can be carried by three channels: 1) conduction electrons in the metal can excite phonons in the diamond; 2) electrons in the metal can excite phonons in the metal, which then couple to phonons in the diamond; and 3) phonons in the metal can excite phonons in the diamond. In the particular case of a metal-diamond interface, phonon-phonon coupling (i.e., channels 1 and 2 described above) is believed to represent the dominant thermal channel. However, it is not energetically possible for a phonon in the metal to directly excite a phonon in diamond, since the mean phonon energy in diamond is much higher than that of phonons in metals.

Recent studies support a partial transmission model in which heat transfer involves a phonon in the diamond lattice that is scattered by a phonon from the metal layer. Other work in the field suggests that phonon-phonon thermal conductance at a metal/insulator interface can be optimized by matching of acoustic impedances. The acoustic impedance, Z, of a material is defined by:

$$Z = \rho v_g$$

where $\rho$ is the mass density and $v_g$ is the mean group velocity of phonons. Phonon scattering at a material interface can be quantified by the impedance mismatch between the dissimilar materials, as follows:

$$R = \left( \frac{Z_1 - Z_2}{Z_1 + Z_2} \right)$$

That is, if the phonons do not carry the same energy in both medium 1 and medium 2, then some of the phonons must be reflected. This is the source of the interface resistance.

This reflection effect with its associated thermal resistance can never be completely eliminated at a junction between dissimilar materials. However, it can be minimized by using an interface layer with an acoustic impedance that is the geometric mean of impedances in the two dissimilar layers, as provided by:

$$Z_i = \sqrt{Z_1 Z_2}$$

Where $Z_i$ is the acoustic impedance of the interface layer and $Z_1$ and $Z_2$ are the acoustic impedances of the adjacent dissimilar materials. The use of acoustically matched interface layers has been found to reduce the thermal interface resistance by up to a factor of two. It is also possible to use multiple interface layers to achieve even lower thermal resistance.

In accordance with the present invention, an interface layer is used that has both strong mechanical adhesion to diamond and an optimal acoustic impedance match between the target metal and the diamond substrate. Using the above impedance matching relation, the following acoustic matching parameter may be derived:

$$Z_i / \sqrt{Z_1 Z_2}$$

where, as above, $Z_i$ is the acoustic impedance of the interface layer and $Z_1$ and $Z_2$ are the acoustic impedances of the metal target and diamond layers respectively. This acoustic matching parameter should be as close as possible to 1.0 in order to minimize thermal interface resistance.

The tables below show the acoustic matching parameters for copper/diamond and silver/diamond structures using different interface materials. Table 1 shows the acoustic matching parameters for copper/diamond with respective interface layers of Cr, Ti, Zr, Mo, W, $Cr_3C_2$, TiC, MoC and WC.

TABLE 1

| Interface layer | Cu alloys | Cr | Ti | Zr | Mo | W | $Cr_3C_2$ | TiC | MoC | WC |
|---|---|---|---|---|---|---|---|---|---|---|
| Acoustic match $Z_i/\sqrt{Z_1 Z_2}$ | 2.3 | 1.9 | 1.7 | 3.3 | 3.5 | 6.7 | 1.1 | 0.9 | 1.2 | 1.7 |

As shown, metallic interface layers of Cu alloys (with less than 2% of B, Ti, Cr or Zr), and those of Cr, Ti, Zr, Mo and W, are relatively poor acoustic matches. The best acoustic matches are layers of $Cr_3C_2$ and TiC. Table 2 shows the acoustic matching parameters for silver/diamond with respective interface layers of Cr, Ti, Zr, Mo, W, $Cr_3C_2$, TiC, MoC and WC.

TABLE 2

| Interface layer | Ag alloys | Cr | Ti | Zr | Mo | W | $Cr_3C_2$ | TiC | MoC | WC |
|---|---|---|---|---|---|---|---|---|---|---|
| Acoustic match $Z_i/\sqrt{Z_1 Z_2}$) | 3.0 | 1.4 | 1.3 | 2.5 | 2.7 | 5.1 | 0.9 | 0.7 | 0.94 | 1.3 |

In this case, metallic interface layers of Ag alloys (with less than 2% of B, Ti, Cr or Zr), Zr, Mo and W are relatively poor acoustic impedance matches, while layers of Cr and Ti are better. The best acoustically matched interface layers are $Cr_3C_2$ and MoC.

As shown above, for copper-diamond, typical metallic interface layers are poor acoustic impedance matches. Instead, the best matches are chromium carbide, titanium carbide and molybdenum carbide. The best acoustic impedance matches for silver-diamond are chromium carbide and molybdenum carbide, while metallic Cr and Ti are also acceptable. Those skilled in the art will understand that the foregoing materials is only representative of the approach used for the invention, and that it can be applied to other metals commonly used in analytical tubes.

Cr, Rh and Mo are special cases in the sense that these metals form strong bonds with diamond without an interface layer. But these metals also show an acoustic mismatch and thus benefit from the use of an interposed layer that has a better acoustic match to the diamond substrate. For these materials, however, their own carbides form an excellent acoustic interface. Thus, in one embodiment, a target metal that forms a carbide with a good acoustic interface (such as Cr, Rh or Mo) is coated onto a diamond substrate, and is then heat treated to form a carbide layer of about 5-10 nm. In this way, a single layer may be used that provides both a strong mechanical bond and a good acoustic match to the diamond.

For an embodiment in which an intermediate layer of copper or silver is used between a diamond substrate a target anode material of relatively low thermal conductivity (such as chromium, cobalt, molybdenum, rhodium and tungsten) to enhance heat dissipation, an impedance matching layer should be used between the diamond and copper or silver heat dissipation materials. However, no acoustic matching layer is necessary between the two metal layers, since the main heat flow in both metal layers is carried by conduction electrons rather than by phonons.

Figure 6:
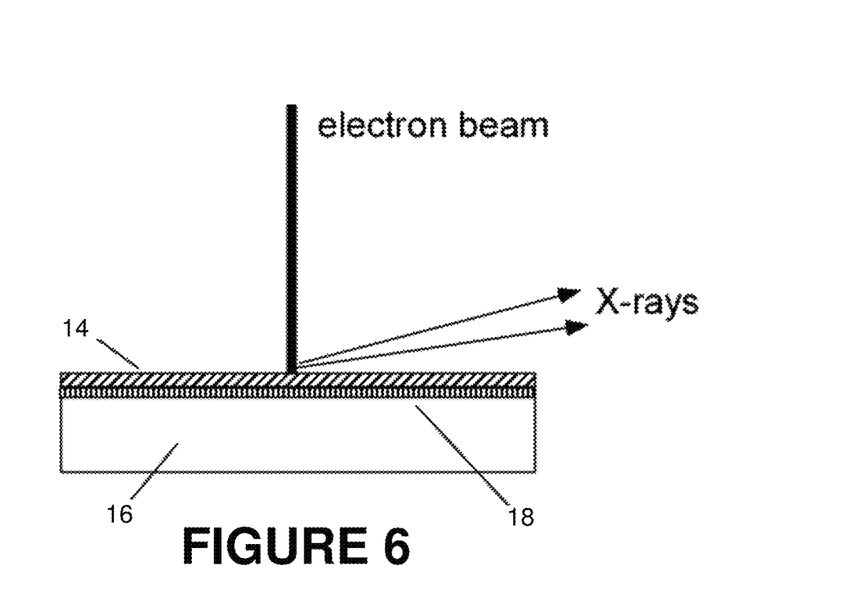
FIG. 6 is a schematic view of a target anode structure of an analytical X-ray tube in which a target material is separated from a diamond substrate by an acoustic matching interface layer.
Figure 7:
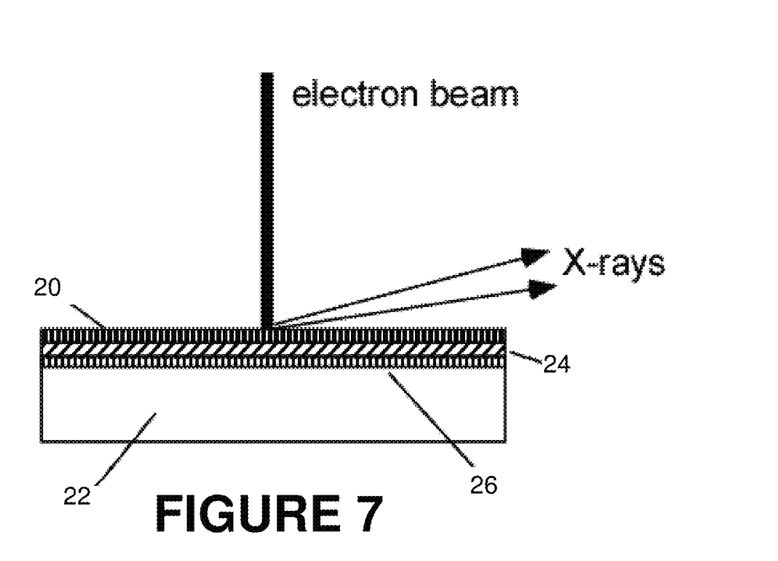
FIG. 7 is a schematic view of a target anode structure of an analytical X-ray tube in which a lower thermal conductivity target material is bonded to a diamond substrate by an intermediate carbide layer.
Figure 8:
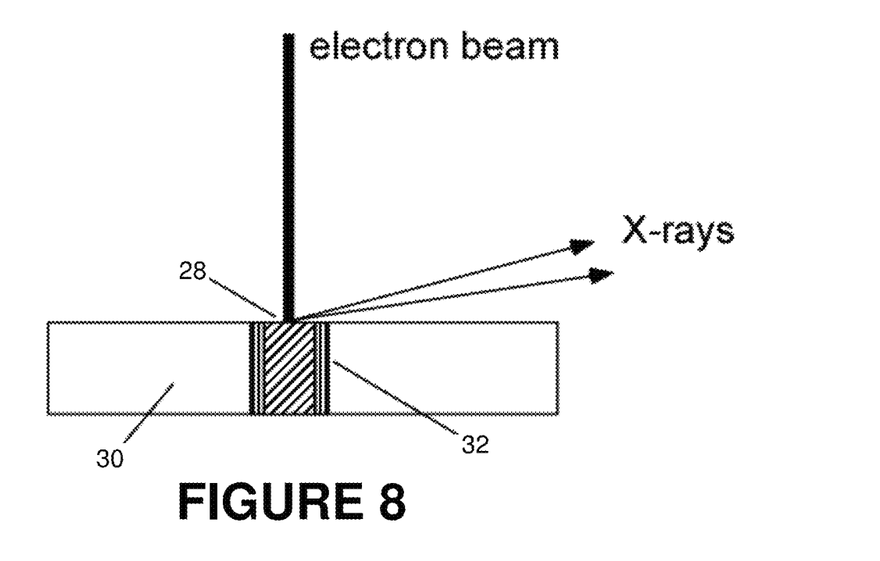
FIG. 8 is a schematic view of a target anode structure of an analytical X-ray tube in which a target material is located in a center region and is surrounded by a diamond "substrate."

Some example X-ray tube configurations are shown, respectively, in FIGS. 6-8. These X-ray tubes may be microfocus, sealed X-ray tubes having a target metal such as chromium, cobalt, copper, molybdenum, silver or tungsten. A diamond substrate is used, which may be CVD diamond, crystal diamond or isotopically pure diamond.

For copper or silver targets, the thickness of the metal layer is chosen so that the temperature at the metal-diamond interface is in the range of 600-800 K. Between the target metal layer and the substrate, a carbide layer may be used to improve mechanical bonding of the target metal to the diamond substrate. For a copper target, an interface layer of either TiC or $Cr_3C_2$ with a thickness of 3-10 nm may be employed to minimize the interface resistance. For a silver target, an interface layer of $Cr_3C_2$ or MoC with a thickness of 3-10 nm can be used as the interface layer. An example of this is shown in FIG. 6, in which a copper or silver target anode material 14 is separated from a diamond substrate 16 by an interface layer 18 of a material, such as TiC or MoC, that provides a better acoustic matching (and therefore lower thermal resistance) than if the anode material was deposited directly on the substrate.

For targets having a lower thermal conductivity, such as chromium, cobalt, molybdenum, rhodium or tungsten, a multilayer structure is provided in which 3-5 μm of the target metal is coated onto an intermediate heat spreading layer consisting of a 5-15 μm layer of a metal with higher thermal conductivity, either copper or silver. In this case, the target layer should be typically on the order of 3-5 microns thick so that efficient absorption of the incident electrons is achieved and, for the higher melting point targets (Mo, Rh and W), the interface temperature with the intermediate copper or silver layer is lower than the melting point of the intermediate layer (e.g., below 1200 K for copper). In one version of this embodiment, the copper or silver intermediate layer is attached to the diamond substrate with an appropriate carbide intermediate layer (e.g., 3-10 nm of TiC or $Cr_3C_2$ for copper, or 3-10 nm of MoC or $Cr_3C_2$ for silver).

As above, the temperature of the interface layer should be in the range of 600-800 K. An example of this is shown in FIG. 7, in which a lower thermal conductivity target material 20 is separated from a diamond substrate 22 by two intermediate layers. Adjacent to the target material is an intermediate heat spreading layer 24, typically of copper or silver. This layer 24 is, in turn, separated from the substrate 22 by an interface layer 26 that provides a better acoustic matching to the substrate. If an appropriate carbide material is used for this layer, as described above, an enhanced mechanical bond is also formed between the anode and the substrate.

In an exemplary embodiment of the fabrication process, a suitable diamond substrate is first coated with an interface layer by a standard method (including PVD, CVD or sputtering). A copper or silver layer is then added by a similar standard coating method. The interface layer may be deposited directly as a carbide, or may be deposited first as a metal and then later converted into a carbide by reacting with the diamond at an elevated temperature. If the deposited copper or silver layer is the target material, there are no additional deposition steps. However, if the target material is to be a lower thermal conductivity material (such as Cr, Co, Mo or W), that material is deposited as a final layer of about 3-5 microns on previously-deposited copper or silver layer. In this case, the copper or silver intermediate layer is about 5-15 μm thick.

FIG. 8 shows an alternative configuration of an anode according to the present invention. In this embodiment, the geometry is not one of horizontal layers but, rather, of laterally separated regions. The target material 28 is located in a center region, and is surrounded by a diamond "substrate" 30. Although the materials are in a different orientation, the functionality of this embodiment is essentially the same as those discussed above. In particular, an interface layer 32 may be used adjacent to the diamond that provides an improved thermal transfer between the diamond and the metal, and a copper or silver intermediate metal layer may be used between the target material 28 and the interface layer 32 if the target material is of a lower thermal conductivity.

The invention claimed is:

1. An X-ray tube comprising:
a target anode comprising a single, continuous layer of target material that emits characteristic X-rays in response to excitation by an electron beam;
a diamond substrate upon which the target anode is located; and
an intermediate layer between the diamond substrate and the target material, the intermediate layer comprising a metal carbide,
wherein the intermediate layer comprises a material having a first acoustic impedance $Z_i$, the target material has a second acoustic impedance $Z_1$, and the diamond substrate has a third acoustic impedance $Z_2$, wherein the first acoustic impedance of the intermediate layer closely matches a geometric mean $\sqrt{Z_1 Z_2}$ of the acoustic impedances of the target material and the diamond substrate, and wherein an acoustic impedance matching parameter $Z_i/\sqrt{Z_1 Z_2}$ is between 0.75 and 1.5.

2. An X-ray tube according to claim 1, wherein the target material comprises one of copper and silver.

3. An X-ray tube according to claim 1, wherein an operating temperature at an interface with the diamond substrate is between 600 K and 800 K.

4. An X-ray tube according to claim 1, wherein the target material comprises copper and the intermediate layer comprises at least one of titanium carbide (TiC) and chromium carbide ($Cr_3C_2$).

5. An X-ray tube according to claim 1, wherein the target material comprises silver and the intermediate layer comprises at least one of chromium carbide ($Cr_3C_2$) and molybdenum carbide (MoC).

6. An X-ray tube according to claim 1, wherein the target material comprises one of chromium (Cr), molybdenum (Mo), rhodium (Rh) and tungsten (W).

7. An X-ray tube according to claim 1, wherein the target material has a depth of from 3-5 μm.

8. An X-ray tube according to claim 1, wherein the intermediate layer is a deposited layer.

9. An X-ray tube according to claim 1, wherein the target material comprises an alloy that includes a carbide forming metal, and wherein the metal carbide of the intermediate layer is formed from the carbide forming metal of the target material.

10. An X-ray tube according to claim 1, wherein a surface of the target material exposed to the electron beam is surrounded by the diamond substrate in a lateral direction.

11. An X-ray tube comprising:
a target anode comprising a target material having a relatively low thermal conductivity that emits characteristic X-rays in response to excitation by an electron beam;
a diamond substrate;
a heat dissipation layer adjacent to the target material, wherein the heat dissipation layer has a thermal conductivity that is at least twice as high as a thermal conductivity of the target material; and
an interface layer located between the heat dissipation layer and the diamond substrate, wherein the interface layer comprises a material having a first acoustic impedance $Z_i$, the heat dissipation layer comprises a material having a second acoustic impedance $Z_1$, and the diamond substrate has a third acoustic impedance $Z_2$, wherein the first acoustic impedance of the interface layer closely matches a geometric mean $\sqrt{Z_1 Z_2}$ of the acoustic impedances of the heat dissipation layer and the diamond substrate, and wherein an acoustic impedance matching parameter $Z_i/\sqrt{Z_1 Z_2}$ is between 0.75 and 1.5.

12. An X-ray tube according to claim 11, wherein the target material comprises one of chromium (Cr), Molybdenum (Mo), rhodium (Rh) and tungsten (W).

13. An X-ray tube according to claim 11, wherein the heat dissipation layer comprises at least one of copper and silver.

* * * * *